(12) United States Patent
Cordes et al.

(10) Patent No.: US 7,385,457 B2
(45) Date of Patent: Jun. 10, 2008

(54) FLEXIBLE CAPACITIVE COUPLER ASSEMBLY AND METHOD OF MANUFACTURE

(75) Inventors: Steven A. Cordes, Yorktown Heights, NY (US); Matthew J. Farinelli, Bronx, NY (US); Robert B. Garner, San Jose, CA (US); Winfried W. Wilcke, Los Altos Hills, CA (US)

(73) Assignee: International Business Machines Corporation, Armonk, NY (US)

( * ) Notice: Subject to any disclaimer, the term of this patent is extended or adjusted under 35 U.S.C. 154(b) by 257 days.

(21) Appl. No.: 11/390,510

(22) Filed: Mar. 27, 2006

(65) Prior Publication Data

US 2007/0085625 A1 Apr. 19, 2007

Related U.S. Application Data

(63) Continuation-in-part of application No. 10/264,893, filed on Oct. 3, 2002, now Pat. No. 7,038,553.

(51) Int. Cl.
H01P 1/04 (2006.01)

(52) U.S. Cl. ............... 333/24 C; 333/260; 257/E23.01; 257/E25.023; 439/950

(58) Field of Classification Search ............. 333/24 C, 333/260; 257/E23.01, E25.023; 439/950
See application file for complete search history.

(56) References Cited

U.S. PATENT DOCUMENTS

| | | | |
|---|---|---|---|
| 3,921,167 A * | 11/1975 | Fox ............................. 307/116 |
| 4,423,465 A * | 12/1983 | Teng-Ching et al. ........ 361/730 |
| 4,486,739 A | 12/1984 | Franaszek et al. |
| 4,674,010 A | 6/1987 | van den Steen |
| 4,884,982 A | 12/1989 | Fleming et al. |
| 5,274,336 A | 12/1993 | Crook et al. |
| 5,629,838 A | 5/1997 | Knight et al. |
| 5,691,885 A * | 11/1997 | Ward et al. .................. 361/735 |
| 5,714,864 A | 2/1998 | Rose et al. |
| 5,870,067 A | 2/1999 | Smith |
| 5,936,841 A | 8/1999 | Kantner et al. |
| 5,977,841 A | 11/1999 | Lee et al. |
| 6,033,263 A | 3/2000 | Weidler et al. |
| 6,205,138 B1 | 3/2001 | Nihal et al. |
| 6,299,280 B1 | 10/2001 | Coudray et al. |
| 6,362,972 B1 | 3/2002 | Panella |
| 6,525,620 B1 * | 2/2003 | Barabash ................... 333/24 C |
| 6,687,128 B2 * | 2/2004 | Tokuhara .................... 361/724 |

* cited by examiner

*Primary Examiner*—Robert J. Pascal
*Assistant Examiner*—Kimberly E Glenn
(74) *Attorney, Agent, or Firm*—Cantor Colburn LLP; Mark Wardas

(57) ABSTRACT

A flexible capacitive coupler assembly includes a flexible dielectric substrate assembly having a front surface and a rear surface, the front surface having thereon a macroscopic metal capacitive pad. A package supports the flexible dielectric substrate. An electrical connection is made to package wiring or leads on the flexible dielectric substrate to establish electrical contact with a computer subsystem.

19 Claims, 17 Drawing Sheets

DEFORMATION DUE TO DIRECT SOLDER CONNECTION

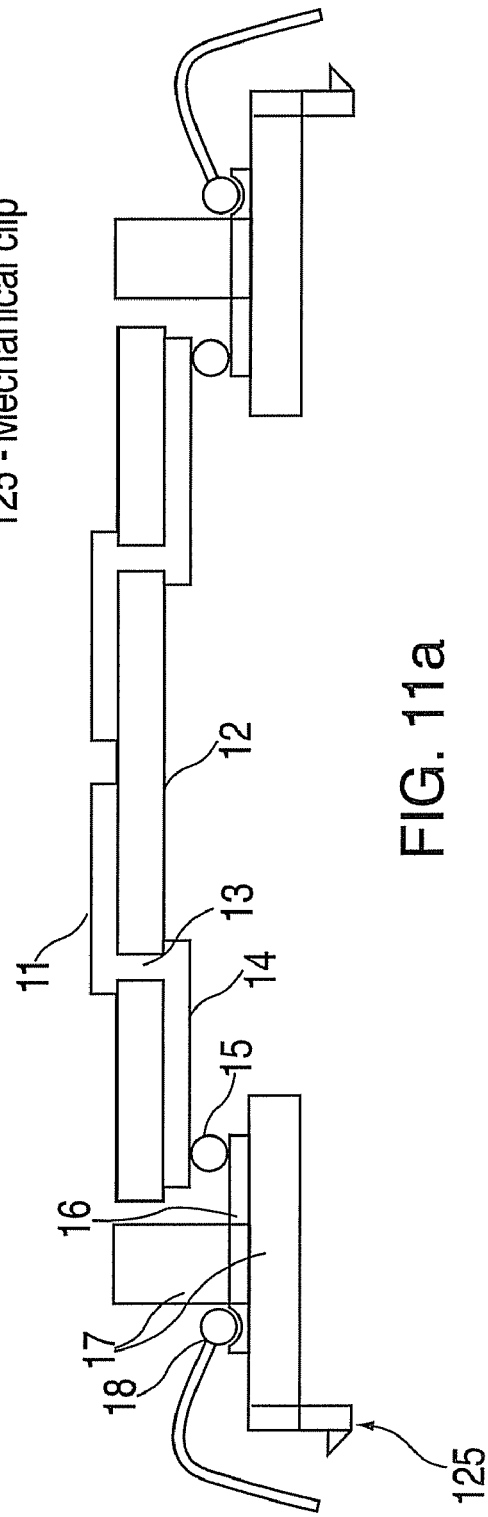

FLEXIBLE CAPACITIVE COUPLER ASSEMBLY AND METHOD OF MANUFACTURE

CROSS-REFERENCE TO RELATED APPLICATIONS

This application is a continuation-in-part of U.S. patent application Ser. No. 10/264,893 filed Oct. 3, 2002 now U.S. Pat. No. 7,038,553, the entire contents of which are incorporated herein by reference.

TECHNICAL FIELD

The present invention relates to scalable computer systems comprised of subsystems connected via flexible capacitive couplers mounted on subsystem surfaces for communication with the adjacent subsystems.

BACKGROUND OF THE INVENTION

Contemporary computer and communications systems commonly comprise several subsystems, each implementing one or more computation or communication functions. Each subsystem is outfitted with external connector sockets for communicating with other subsystems and for drawing power. The subsystems are mounted in proximity to each other in mechanical structures in the form of industry standard sized racks or custom-sized chassis.

FIG. 1A illustrates a representative contemporary computing center having two servers 1 and a data storage 2. The servers 1 include subsystems 3 that are housed in industry-standard 19-inch racks. The subsystems 4 of the storage 2 are housed in a custom-size chassis. The servers 1 and storage 2 are typically in an environmentally controlled data center or server room. The subsystems 3-4 are interconnected with each other and to outside communication links through electronic or optical cables 5. AC or DC electrical power must also be supplied to the subsystems 3-4 and is typically distributed via under floor cabling 6 from a power source.

The rack/chassis-based architecture of FIG. 1A has several advantages: (1) the subsystems may be arbitrarily arranged in the room, subject to cooling and cabling distance constraints, and (2) the subsystems may have different form factors. However, this type of packaging suffers from several operational disadvantages: (1) scaling difficulty; (2) cable management; (3) connector unreliability; and (4) unreliability of wire and cable assemblies. These problems contribute to the overall unreliability of today's high-performance computer and communications systems and lead to increased costs of ownership, maintenance, and upgrade of the systems.

The first disadvantage of current computer and communications systems is the difficulty one would encounter when the system's capacity or functions need to be expanded. This can occur even if a system was designed to accommodate a certain degree of growth. For example, to connect a new server into a network, additional communication cables need to be connected to a network switch. However, if the switch is fully allocated at capacity with insufficient free network ports, the upgrade becomes difficult and costly, particularly if the system must remain operational while the expansion is performed.

The second disadvantage of current computer and communications systems is the management of interconnect cabling and wiring. Given the large number of wires and cables in a computer facility, it is not uncommon that service and support personnel may incorrectly connect or disconnect a cable. The potential for other errors, such as plugging a cable into a wrong subsystem and leaving a cable unconnected, can also occur, particularly when system operation must be restored quickly. For optical cables, one must select the proper speed, wavelength, and distance parameters.

The third disadvantage of current computer and communications systems is the unreliability of connectors. Electrical connectors can degrade over time due to micro-fretting wear, which can lead to corrosion. As a metal connector corrodes, its electrical resistance increases, causing intermittent or hard failures in the system. Optical connectors may be mishandled, jarred, or contaminated by finger oil or dust, causing an intermittent open circuit in the system. In addition, optical-to-electrical transceivers can fail. These hazards and failures result in an increased cost of maintenance for the system.

The fourth disadvantage of current computer systems is the unreliability and cost of cables. Both electrical and optical cables can be broken, cracked, bent, compressed, or otherwise mishandled. Glass-based optical cables can also be damaged if stepped on or if the maximum bending radius is exceeded. Although cables are typically designed to meet certain system parameters, they are not always manufactured to such tolerances.

Electrical cables may also carry undesirable shield or ground currents between subsystems with chassis grounds or signal grounds at different electrical potentials, particularly when the subsystems are powered from different AC branch circuits. Cables can also undesirably pick up external electromagnetic interference or electrostatic discharges. These unwanted shield, ground, or signal currents can cause intermittent or hard errors in the communication between the subsystems, resulting in transient or hard failures in the whole systems.

The above disadvantages contribute to the unreliability, inflexibility, and high cost of ownership of existing computer and communications systems. Therefore, there remains a need for a modular computer system that has reliable and simple interconnection, and is easy to expand and service. To address this need, a scalable computer system has been previously disclosed in U.S. patent application Ser. No. 10/264,893, which uses upon surface-mounted capacitive couplers for intercommunication. These couplers can be made from a variety of materials with different advantages. Rigid couplers, such as ceramic, have the advantage of being commercially available and easily integrated into a package by nature of the strength of the material. Being thick and self supporting they can be easily mounted mechanically and easily soldered for electrical connection.

Conversely, thin, flexible, polymer-type couplers, such as Kapton, Upilex, Teflon, etc, have different advantages. Technically, thin flexible couplers are advantages primarily due to the fact that their flexible nature eliminates the variable of substrate flatness. When substrates are not flat, the gap that is created between the halves of the coupler are not only large, but variable, which will limit the speed of data transfer. The flexibility of the flexible couplers allow them to be assembled in such a way as to have the couplers in intimate contact, such that only a dielectric layer over the metal coupler pad defines the separation.

Available flexible dielectric substrates, such as Kapton, also have the advantage of improved signal characteristics. The lower intrinsic dielectric constant of these materials reduces interfering cross-talk between adjacent channels.

Flexible couplers have the advantage of reduced manufacturing costs. Where rigid couplers, such as ceramic, have high materials costs and machining costs, flexible organic material is inexpensive and can be bulk processed. It also can be quickly and easily laser machined.

Finally, although rigid couplers are durable for mounting and soldering, they are brittle and therefore fragile. Rigid couplers such as ceramic will shatter on impact or if twisted. Flexible organic dielectrics are extremely durable to shocks or twisting. They are also able to withstand high temperatures and are chemically resistant.

The advantages of thin flexible couplers make them outperform the rigid interposers. However, integration of these couplers relies on the ability to make connection to the back side of the coupler via soldering. In the case of existing rigid couplers, such as ceramic, this is not an issue. However, in the case of a flexible dielectric materials (e.g. Kapton, Teflon, Upilex, etc), soldering to the backside of the coupler impairs the function of the coupler. Soldering a wire to the back side of a thin flexible material has a variety of challenges associated with it. Due to the thin cross-section of these dielectric films, and their poor thermal conductivity, the localized heating associated with soldering results in local hot spots which heavily taxes materials characteristics, such as adhesion of metals. Even more important than this is the form taken by the solidified solder, and the resulting deformation of the dielectric. Due mostly to the rigidity of the wire being connected to the coupler, the front surface of the coupler is most likely going to be deformed during soldering as shown in FIG. 1B. In FIG 1B, the dielectric film 7 is deformed along with the bonding pad 8 when the wire 9 is soldered to the pad using solder 10.

Even if the deformation of the front surface can be overcome such that the front surface of the coupler is not significantly compromised by the soldering operation, there are still several problems associated with direct soldering of wires to the coupler. Connecting multiple wires to the small area provided by the coupler can present similar problems that the existing system includes meaning cable management and unreliability of wire and manual solder connections. These wires can also limit the freedom of motion of the coupler, limiting the proximity of the coupler to the matching coupler. Finally, individual soldering of each wire will drive up cost, compounded by the additional cost it would require to overcome these technical challenges listed.

There is a need in the art for a flexible capacitive coupler assembly for providing for communications between computer subsystems.

SUMMARY OF THE INVENTION

The shortcomings of the prior art are overcome and additional advantages are provided through the provision of a flexible capacitive coupler assembly.

Embodiments include a flexible capacitive coupler assembly including a flexible dielectric substrate assembly having a front surface and a rear surface, the front surface having thereon a macroscopic metal capacitive pad, the rear surface having back-side wiring. The substrate has one or more thru-vias for making electrical connection between the metal pad and the back-side wiring. A package supports the flexible dielectric substrate and has package wiring thereon. A plurality of ball grid array solder balls electrically connect the package wiring to the flexible dielectric substrate back-side wiring.

Additional embodiments include a flexible capacitive coupler assembly including a flexible dielectric substrate assembly having a front surface and a rear surface, the front surface having thereon a macroscopic metal capacitive pad and leads extending towards an edge of the flexible dielectric substrate. A package supports the flexible dielectric substrate assembly and the flexible dielectric substrate assembly is mechanically secured to the package. An electrical connection is provided from the leads on the flexible dielectric substrate assembly for making electrical connection with a computer subsystem.

Additional embodiments include a flexible capacitive coupler assembly including a flexible dielectric substrate assembly having a front surface and a rear surface, the front surface having thereon a macroscopic metal capacitive pad and leads extending towards an edge of the flexible dielectric substrate. A package supports the flexible dielectric substrate assembly. The flexible dielectric substrate assembly mechanically is secured to the package and the package having package wiring thereon. Spring-loaded electrical contacts are supported on the package for establishing electrical contact between the package wiring and the leads on the flexible dielectric substrate.

Additional embodiments include a method of manufacturing a flexible capacitive coupler including obtaining a flexible dielectric substrate; patterning macroscopic metal capacitive pads on a front surface of the flexible dielectric substrate; securing the flexible dielectric substrate to a package to mechanically support the flexible dielectric substrate; and establishing an electrical connection between the macroscopic metal capacitive pads and a computer subsystem.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWING

FIG. 11a is a cross-sectional view of the first embodiment of a flexible capacitive coupler.

FIG. 11b is a plan view of FIG. 3a.

FIG. 14b is a plan view of FIG. 14a.

DESCRIPTION OF THE PREFERRED EMBODIMENTS

Figure 1A:
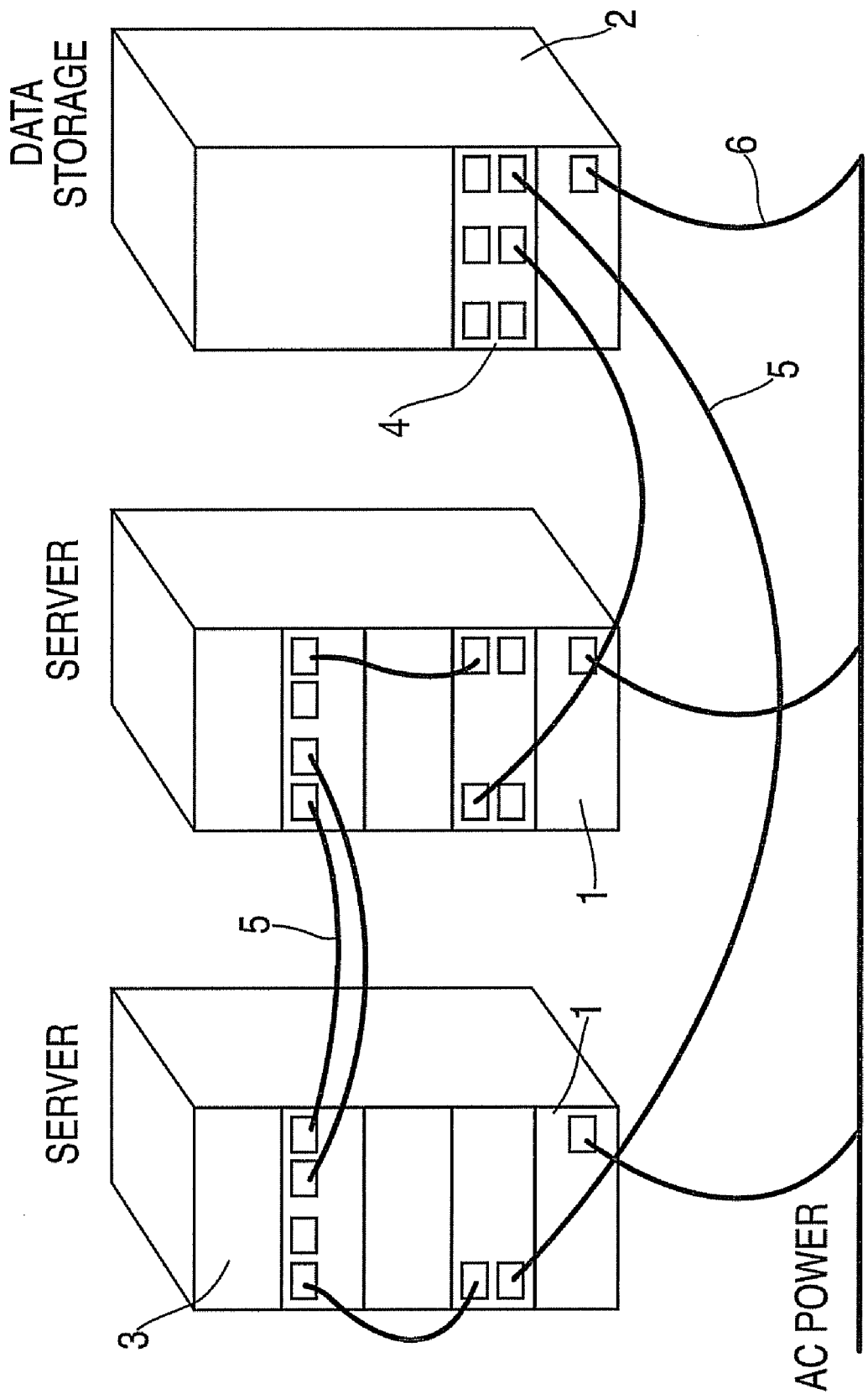
FIG. 1A illustrates a typical configuration of prior art computer and communications systems.
Figure 1B:
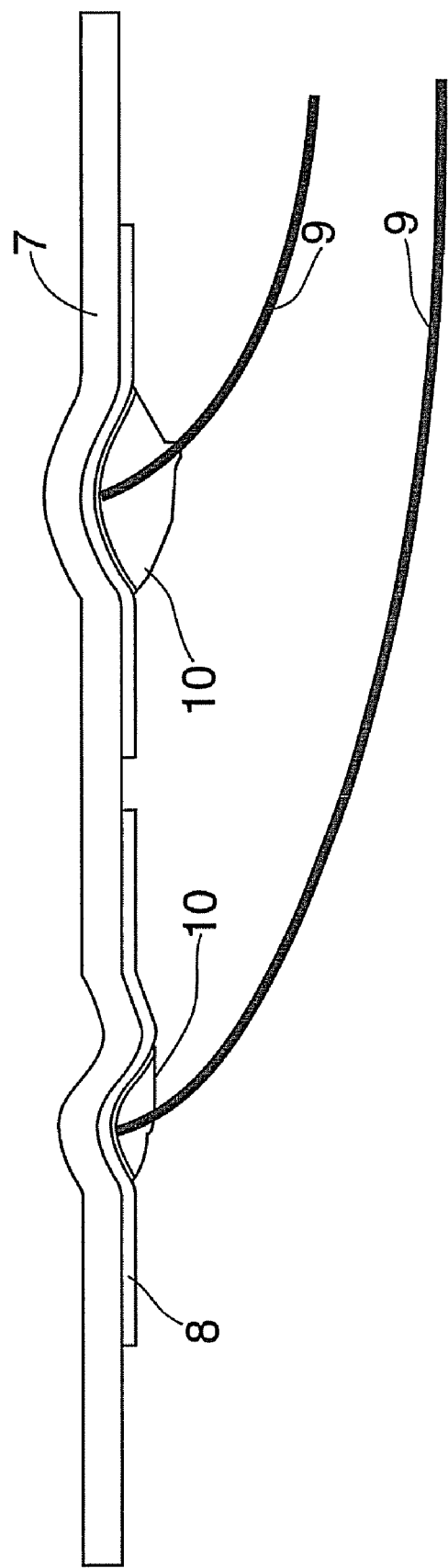
FIG. 1B illustrates difficulty in soldering to a flexible coupler.
Figure 2:
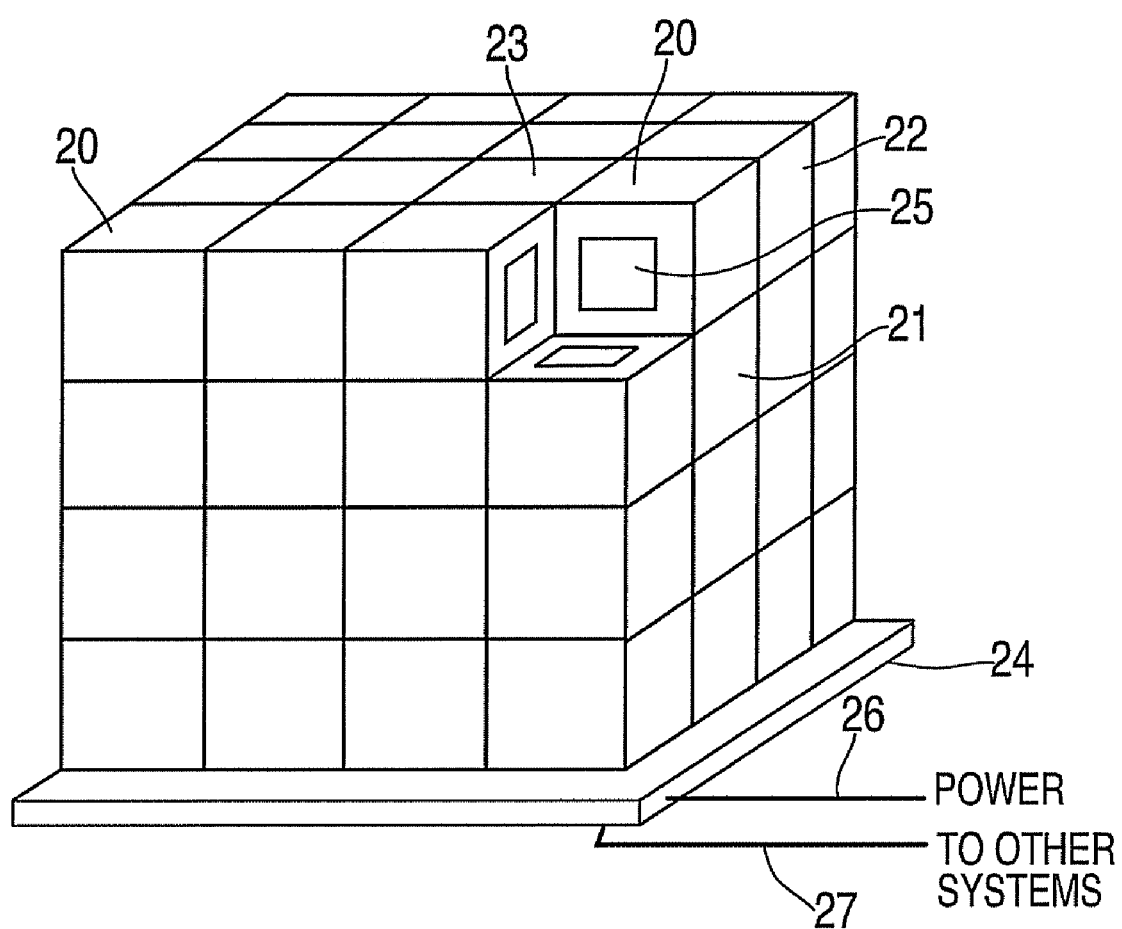
FIG. 2 shows a scalable three-dimensional computer system in accordance with embodiments of the invention.

Embodiments of the invention relate to a highly scalable and dense architecture for computer or communications systems. The systems are made up of externally identical subsystems, also referred to as "bricks", each having capacitive half-couplers on its external surfaces for communicating with the surrounding subsystems. Although capacitive couplers are used to describe the invention, other types of couplers might be adapted for the systems of the invention, such as optical couplers. FIG. 2 shows an embodiment of a scalable three-dimensional computer system of the invention. The system includes multiple subsystems 20 stacked together so that each subsystem has at least one surface that is in close proximity or in contact with at least one surface of another subsystem. For example, in FIG. 2, the subsystem 20 is in contact with the subsystems 21 through 23. Each subsystem surface includes one or more capacitive half-couplers 25 which will be described in detail below. Each subsystem 20 might be a data processing unit (server), a data storage unit, a networking unit, or some other computer-related functions. Through the alignment of the capacitive half-couplers 25, the subsystems 20 together perform the computation or communication functions of the whole system without conventional cables and connectors between them.

In embodiments of the invention, the subsystems 20 reside on a support base 24 to provide mechanical structural support for the subsystems and through which power is delivered to the subsystems with power connection 26. The base 24 may also accommodate connection 27 to other systems or an external communications network. Typically, there is also some mechanism for removing heat generated by the subsystems (not shown).

Figure 3:
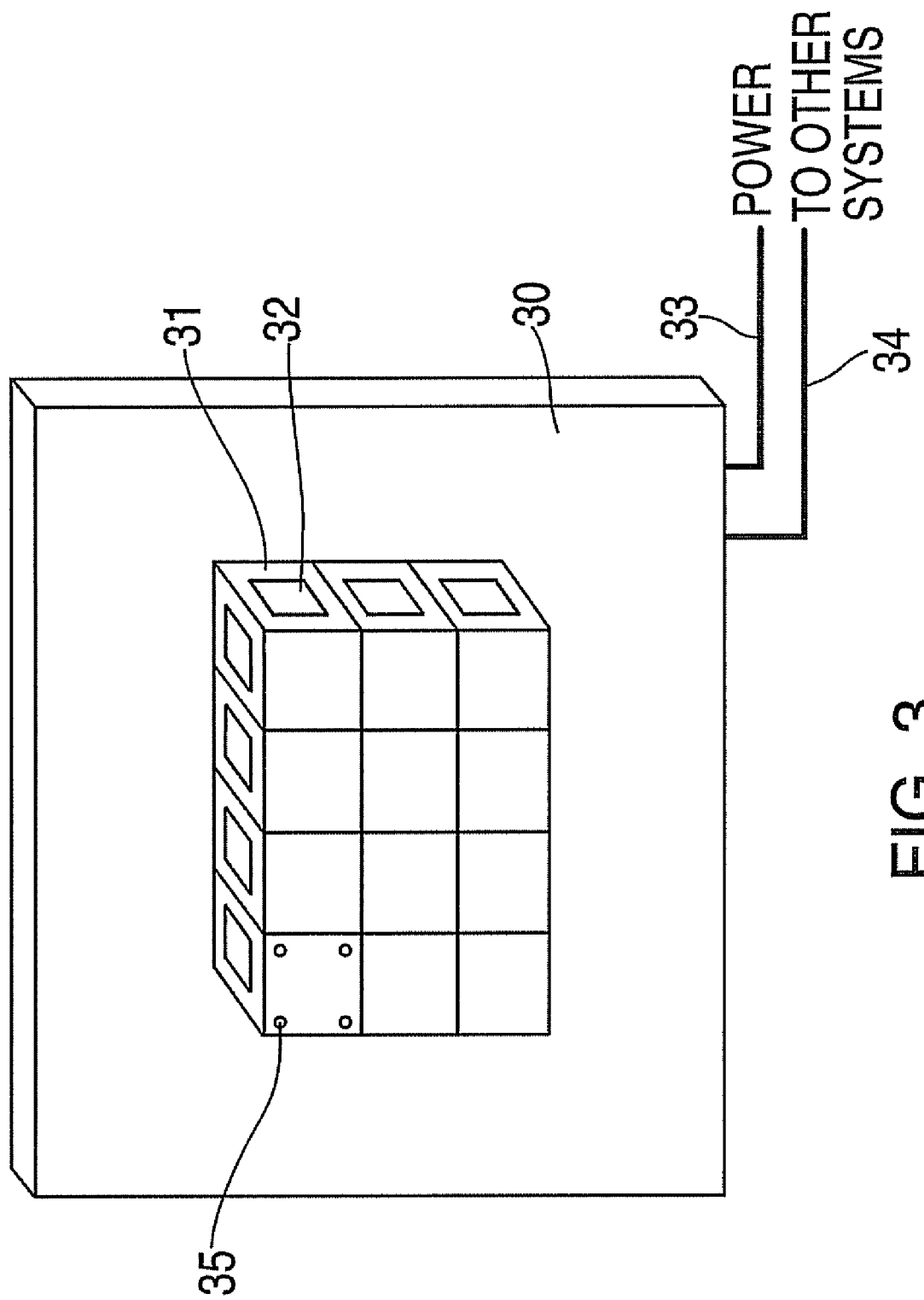
FIG. 3 depicts an embodiment of a wall-mounted scalable two-dimensional computer or communications system.

The subsystems are arranged in a structure such that they are physically very close to each other to form operable capacitive couplers between them. In addition, to form a useful computer or communications system, the subsystem bricks are arranged in a two-dimensional or three-dimensional structure so as to maximize the number of subsystem surfaces in contact with other subsystem surfaces. Although the embodiment of the invention in FIG. 2 is made up of cubical subsystems 20 with six surfaces each, other brick shapes are also possible. For example, the shape of a subsystem may be a triangular prism (five surfaces), a hexagonal prism (eight surfaces), or a dodecahedron (twelve surfaces). FIG. 3 illustrates an example of a two-dimensional structure of cubical subsystems in which the subsystems 31 are attached to a support wall 30. The support wall 30 has power connection 33 through which power is delivered to the subsystems. Each subsystem 31 communicates with its adjacent subsystems through couplers 32. To provide sufficient alignment between opposing half-couplers, mechanical means such as screws 35 may be used to hold the subsystems 31 to the support wall 30 and to hold the subsystems 31 together. In addition, interlocking or alignment means such as surface bumps and depressions may be used to assure that opposing half-couplers are properly positioned, aligned, and touching each other.

Figure 4:
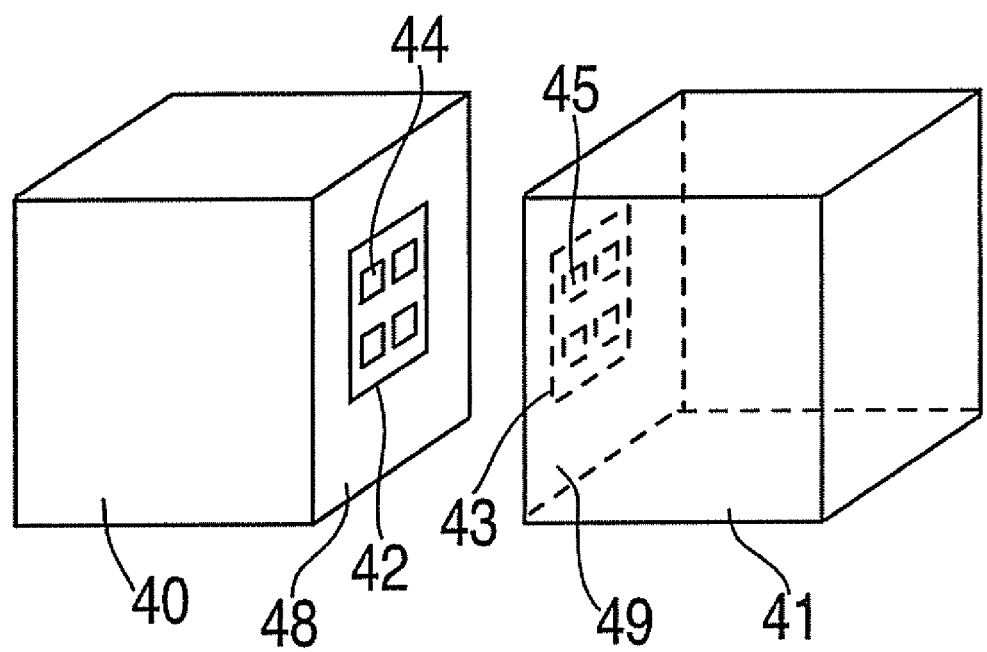
FIG. 4 shows an example of two adjacent subsystem bricks with their aligned, opposing capacitive half-couplers.

FIG. 4 shows two adjacent subsystems 40 and 41 (separated for clarity) with their half-couplers 42 and 43, respectively. The half-couplers 42 and 43 are located on the subsystem surfaces 48 and 49, and are electrically connected to the subsystem circuits, respectively. The subsystem circuits are omitted from this figure for clarity. As the subsystems 48-49 are brought together and properly aligned, the half-couplers 42-43 form a capacitive coupler to support communications between the subsystems.

A capacitive coupler comprises two parts: a half-coupler 42 and a half-coupler 43. Although each half-coupler might include both transmitters and receivers, FIG. 4 shows only a transmitter pad 44 on the half-coupler 42 and a receiver pad 45 on the half-coupler 43 for clarity. The transmitting half-coupler 42 is located on the surface 48 of subsystem 40. The receiving half-coupler 43 is located on the surface 49 of subsystem 41. The half-coupler 42 conveys electrical signals to the half-coupler 43. These signals are time-varying for encoding the information being communicated between the subsystems 40 and 41.

Figure 5:
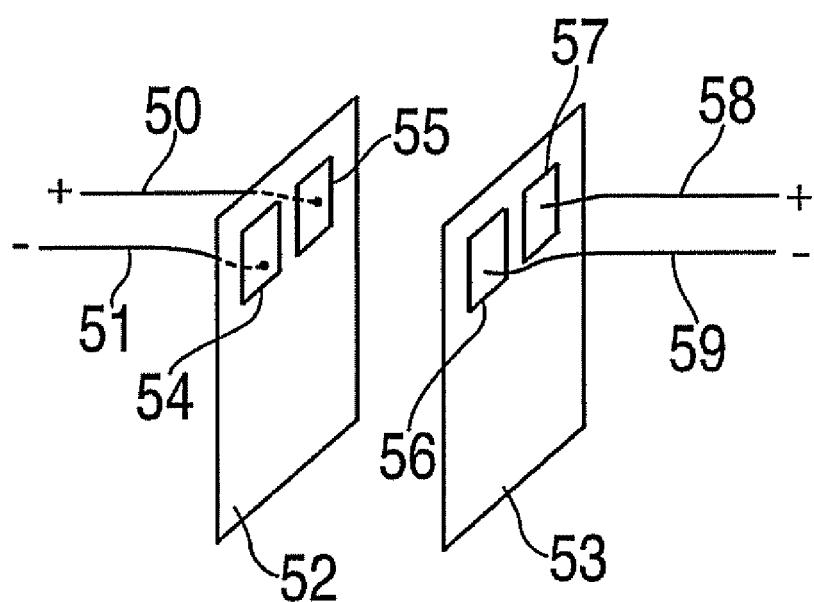
FIG. 5 illustrates an example of electrically conducting pads for the capacitive couplers.

For improved performance, the subsystems typically transmit and receive electrical signals in differential form, i.e., a complementary pair of positive signal and negative signal. Thus, two pairs of pads are used to convey a differential signal between the opposing half-couplers on two subsystems. FIG. 5 illustrates a differential capacitive coupler to support differential signaling. The differential capacitive coupler comprises half-couplers 52 and 53. The half-coupler 52 includes differential pad pair 54 and 55, which are connected to subsystem leads 50 and 51, respectively. The half-coupler 53 includes opposing differential pad pair 56 and 57, which are connected to subsystem leads 58 and 59, respectively. The pads 55 and 57 convey the positive signal of the differential signal. The pads 54-56 convey the negative signal of the differential signal.

Figure 6:
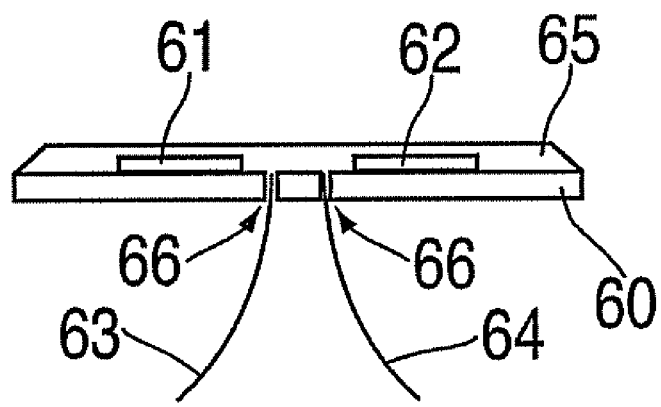
FIG. 6 depicts a side view of an differential capacitive half-coupler in accordance with embodiments of the invention.

FIG. 6 shows a side view of a differential pad pair for supporting a differential signal, such as the differential pad pair 54-55 in FIG. 5. It includes an electrically non-conducting substrate 60 with metallic pads 61 and 62 deposited or affixed to the substrate 60. The metallic pads 61 and 62 are covered by a very thin layer of insulating dielectric material 65, and are connected to the subsystem circuits (not shown) through electrically conducting leads 63 and 64, respectively. Preferably, the leads 63-64 are connected to the metallic pads 61-62 through small vias 66 in the substrate.

In embodiments of the invention, a half-coupler is designed and manufactured using a standard, multi-layer, thick-film, screen-print-process ceramic module technology. The substrate 60 in FIG. 6 is made of Alumina and is 1 mm thick. The metallic pads 61-62 are preferably made of silver palladium with a 7- micron thickness. The dielectric coating 65 is preferably a standard crystalizable, screen-printed, thick-film dielectric material with a relative permittivity or dielectric constant of 8 to 10, and a thickness of 7 microns. An exemplary dielectric material is DuPont Electronics QM44. The dielectric coating over the pads can provide about 500 V of electrostatic discharge (ESD) isolation per pad (or 1000 V between differential pair pads), and 1 Megaohm of resistance. It is assumed that the subsystem electronics provides additional ESD input series protection.

When two capacitive half-couplers are properly aligned to form a capacitive coupler, the dielectric coating 65 is preferably in light physical contact with the dielectric coating of the opposing half coupler. The close proximity of the differential metallic pads and the dielectric coatings, and any undesirable intervening air gap, forms a parallel-plate capacitor. Due to the capacitor's displacement current, a time-varying signal is electromagnetically conveyed between the two opposing half-couplers.

Figure 7:
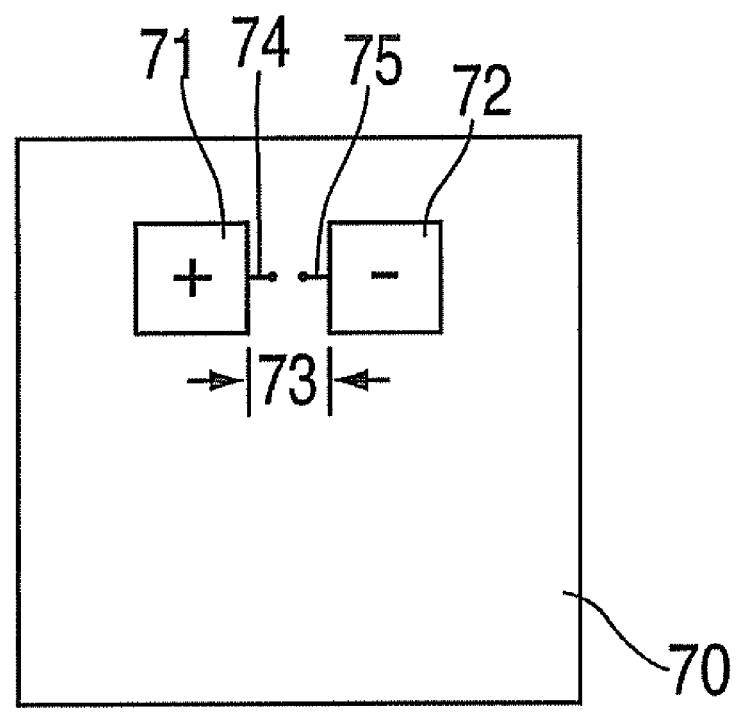
FIG. 7 shows a top view of a differential capacitive half-coupler in accordance with embodiments of the invention.

FIG. 7 depicts a top view of the differential capacitive half-coupler of FIG. 6. The metallic pads 71 and 72 are disposed on a substrate 70 and covered by a dielectric material (not shown). Electrical leads 74 and 75 respectively connect the pads 71 and 72 to subsystem electronics. The outer dimensions of the pads 71-72 are typically 5 to 9 mm on each side. The separation 73 between the positive pad 71 and negative pad 72 is typically in the range of 2 to 6 mm.

Figure 8:
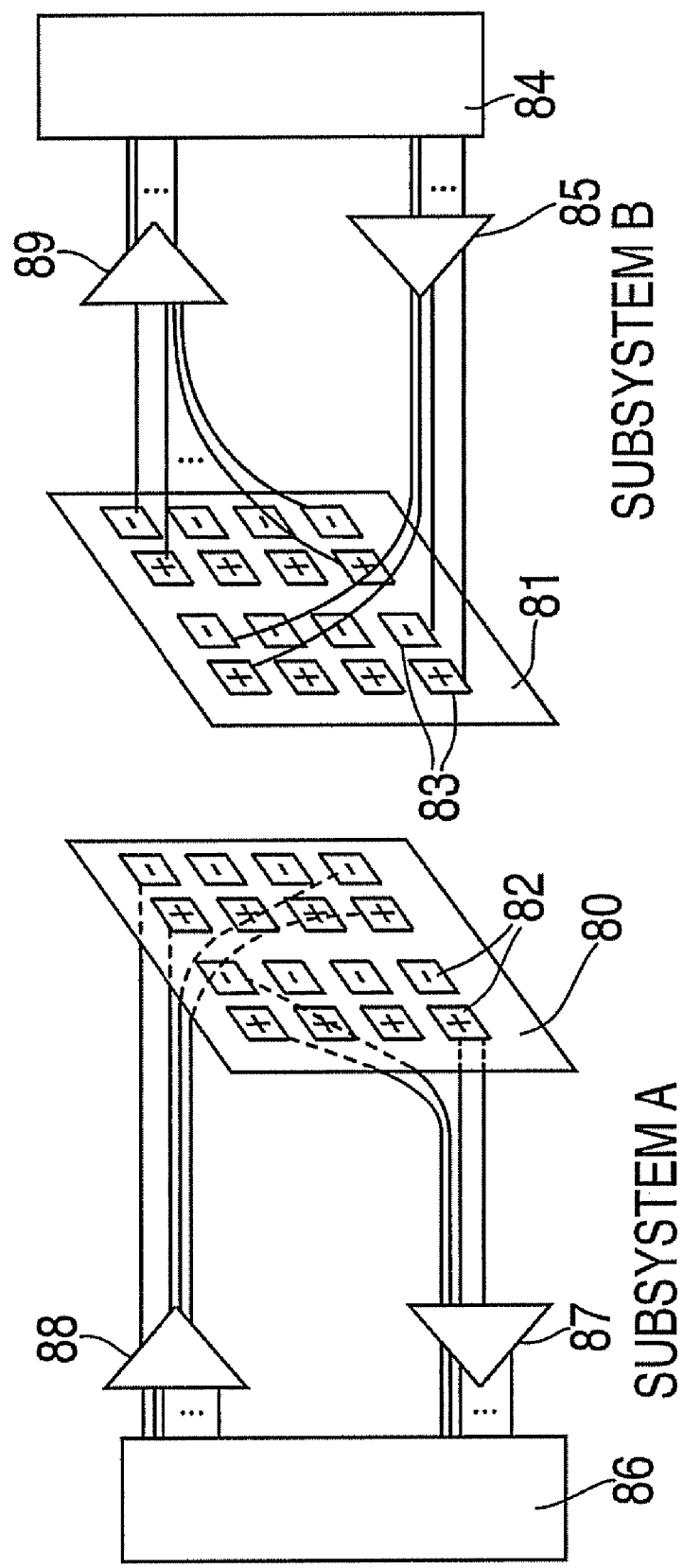
FIG. 8 illustrates a representative wiring between the electrically conducting differential pads and the subsystem electronics in accordance with embodiments of the invention.

FIG. 8 illustrates an embodiment of multiple differential capacitive couplers between two subsystems A and B, shown side-by-side. The subsystems A and B typically include internal electronics circuits 86 and 84, respectively, for providing computing and communication functions as discussed earlier. The differential pad pairs 82 of the subsystem A are located on the half-coupler 80. The differential pad pairs 83 of the subsystem B are located on the half-coupler 81. The transmitting half-couplers of the subsystem A are coupled to the subsystem electronics 86 through a transmitter circuit 88. The receiving differential pad pairs of the subsystem A are coupled to the subsystem electronics 86 through a receiver circuit 87. Similarly, the transmitting and receiving differential pad pairs of the subsystem B are coupled to its electronics 84 through a transmitter circuit 85 and receiver circuit 89, respectively. Note that the receiving pad pairs 82 of subsystem A are opposite the transmitting pad pairs 83 of the subsystem B.

Since there are four differential pad pairs connected to the transmitter 88 of the subsystem A and four differential pad pairs connected to the receiver 89 of the subsystem B, four signal channels are available to convey data from subsystem A to subsystem B simultaneously. In the opposite direction, four channels are available to receive data from subsystem B to subsystem A using the remaining differential pad pairs.

The number of transmitting and receiving couplers in each subsystem depends on the required subsystem interconnect communications bandwidth needed by the subsystem electronics. For example, if each pad or wire pair is capable of 3.125 Gigabits/second, then the aggregate bandwidth per a coupler's four unidirectional differential lines is 12.5 Gbits/second. Bidirectionally, that is 12.5 Gigabits/second into the subsystem and 12.5 Gbits/second out of the subsystem. If each differential line is 8B/10B encoded, the aggregate usable bandwidth between a pair of subsystems with these four bi-directional channels is 20 Gigabits/second, or 2.5 Gigabytes/second.

The half-coupler 80 can convey to the half-coupler 81 of FIG. 8 one or more separate, bit-serial data channels according to a packet-based communications data link physical layer standard, such as Ethernet, Fibre Channel, or Infini-Band.

In embodiments of the invention, it is assumed that the physical layer is based on bit-serial, 8B/10B data encoding, non-return-to-zero, and differential voltage levels. For a description of an 8B/10B encoding, see, for example, "Byte-Oriented DC-balanced (0,4) 8B/10B Partitioned Block Transmission Code," U.S. Pat. No. 4,486,739. A receive clock may be derived from the received serial data stream by the subsystem electronics. Other data link and physical layer protocols might be used, although in general the capacitive coupler requires a sufficient frequency bandwidth to convey the data link code's lowest-frequency components.

Figure 9:
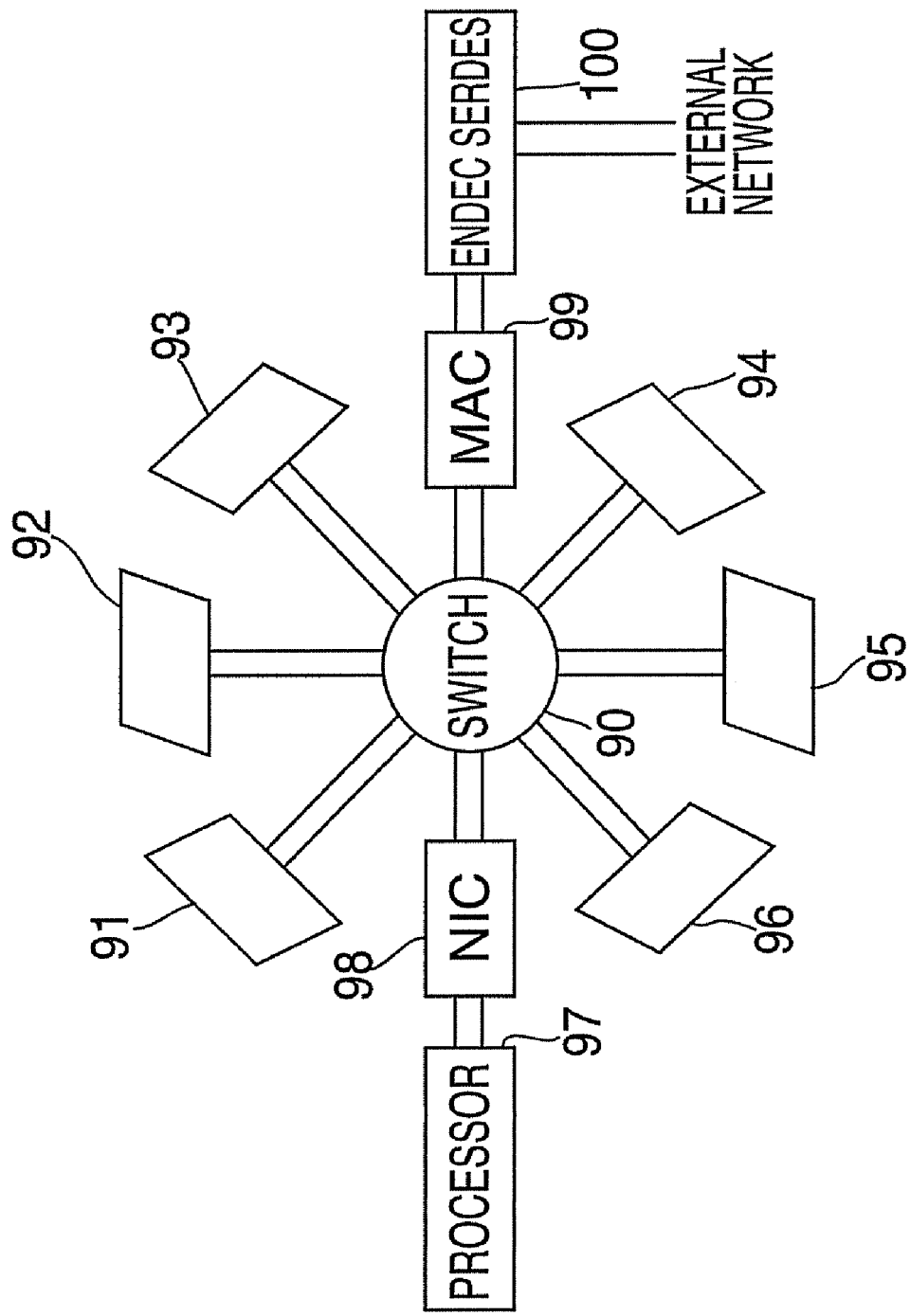
FIG. 9 is a block diagram showing the subsystem circuit functions for a cubical subsystem in accordance with embodiments of to the invention.

FIG. 9 illustrates a block diagram showing the main functions of an embodiment of a cubical subsystem brick. The subsystem includes an 8-port, low-latency packet-based switch chip 90 that is bi-directionally connected to six half-couplers 91-96 and an internal processor 97 through a Network Interface Chip (NIC) 98. In addition, the switch 90 is connected to an external network through a Media Access Controller (MAC) 91 and an Encoder/Decoder (ENDEC) and Serializer/Deserializer (SERDES) chip 92. This connection is typically located on the external surface of an outside subsystem in a system for easy access. Using the same example parameters from above for the couplers, this cubical subsystem would offer 20 Gigabytes/second (8×2.5) of total bandwidth in and out of the subsystem.

In embodiments of the invention, the characteristic impedance of a low-loss differential coupler should be close to some fixed value, such as 100 ohms, from the subsystem electronics, through the wire-pair transmission line, and up to the differential half-couplers. The transmission line can be two separate, 50-ohm coaxial cables; 100-ohm differential-pair coaxial cable; 100-ohm twisted pair of wires; or a twin-ax coaxial cable. A differential signaling pair of wires is preferred because it conveys electromagnetic signals over the two wires and through the coupler via a propagating electromagnetic wave without conveying any significant ground return current or other common-mode currents which could possibly cause unwanted noise interference. The differential signal voltage levels preferred are typically under 1 V peak-to-peak.

Furthermore, a capacitive coupler is designed such that its frequency response is as non-attenuating as reasonably achievable over the expected operating regime, typically for a frequency pass band from 100 MHZ to 7 GHz. The high-frequency roll off requirement is determined by the ability of the receive electronics and to recover the encoded data from the signal, given the receive "eye pattern" at the receive electronics. These signal processing circuits may include the ability to perform inverse transformation on the encoded signals, either before transmission or after reception, in order to remove the frequency-dependent, intersymbol interference. The low-frequency roll off requirement is given by the lowest frequency that needs to be transmitted through the coupler as dictated by the physical layer code and the channel bit-error reliability. As the conveyed data speed and frequency content increases, the requirements for the minimum capacitance decreases. For example, the 8B/10B code defines a code such that there are never more than five consecutive bits of the same polarity on the link. For example, a 3.125 gigabit/second signal (with 320-ps bit-cell widths) does not have significant low-frequency content below 1 /((5+5)×0.32 nS)=312 MHZ.

In embodiments of the invention, during construction and before pad deposition, the half-coupler Alumina substrate is milled using standard silicon wafer grinding machinery to a flatness tolerance of plus or minus 3 microns or better over the necessary pad area. This is done to minimize the size of the unwanted resulting air gap between opposing capacitive half couplers. Because the coupler can be modeled as two capacitors in series—the first, $C_{air}$, due to the dielectric of any air and the second, $C_{coating}$, due to the dielectric coating over the pads—the overall approximate capacitance of a capacitive coupler, calculable by $1/(1/C_{air}+2/C_{coating})$, approaches the value of $C_{air}$ and can not exceed $C_{air}$, even as $C_{coating}$ increases without limit. However, higher dielectric film permittivities, and thus higher $C_{coating}$, are preferred as they result in a total capacitance that more closely approaches the capacitance determined by the air gap, $C_{air}$. The typical capacitance developed between contacting half-couplers, depending on their size and the flatness of the ceramic substrates, ranges to between 20 to 100 picoFarads.

In addition to Alumina, another preferred material for the coupler substrate is a flexible Kapton film, in place of the rigid ceramic plate. An advantage of a Kapton film substrate is that it need not be precisely planar but only needs to conform with its opposing, flexible Kapton half coupler.

As for the dielectric coating over the metallic pads, in addition to Dupont QM44, other high-dielectric materials may be used such as barium titanate which is titanium-oxide based and has a dielectric constant ranging from 30 to 60.

Figure 10:
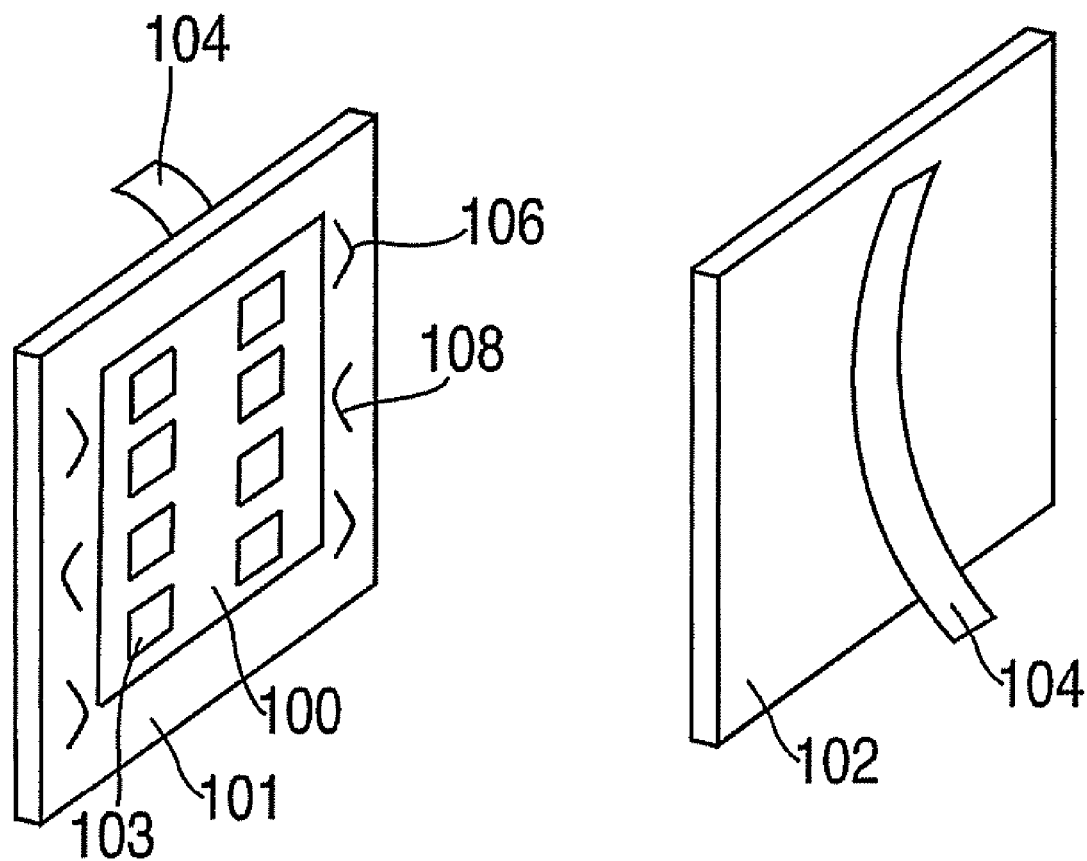
FIG. 10 illustrates an example of the alignment and clamping means for a half-coupler of the invention.

In general, the capacitive half couplers are mounted on a subsystem's external surfaces so that they just touch opposing half-couplers with a light pressure to minimize any intervening air. Alignment bumps and depressions might be provided on the surface of a coupler's carrier so that the transmitting pads are aligned directly opposite the receiving pads. FIG. 10 shows an embodiment of the capacitive couplers with an alignment mechanism and carriers for supplying a light pressure between the half-couplers. The pads 103 are mounted on an Alumina substrate 100, which is mounted in a plastic carrier 101. The plastic carrier 101 is in turn mounted in an opening in the surface of the subsystem (not shown). There is a spring mechanism 104 that gently pushes the carrier 101 attached to the substrate 100 in an outward direction from the center of the subsystem. When two subsystems slide past one another, the plastic carrier 101 is used to separate the substrates of the two half-couplers from each other while traveling past each other. The plastic carrier 101 has bumps 106 that push the opposite plastic carrier 102 away from it while moving, and then, when in position, fit into depressions (similar to depressions 108 shown on carrier 101) in the opposing carrier 102. Depressions 108 in the half-coupler carriers might have a conical shape to guide their opposing bumps into position more accurately. The plastic carriers 101-102 need some freedom of lateral movement to accommodate subsystem misalignment.

Misalignment will decrease the effective capacitance of the coupler and reduce its performance. A misalignment of the pads for a differential coupler in the direction of the positive and negative pads of a differential half-coupler should not be more than some fraction of the separation between the positive and negative pads, or else there will be unwanted positive to negative pad coupling. A misalignment in the direction perpendicular to the two pads of a differential half-coupler should not be more than some fraction of the distance to any surrounding pads or the edge of the substrate, or so much that the capacitance of the coupler is reduced and the signal quality compromised.

The above-described embodiments employ a rigid capacitive coupler to establish communications between computer systems. Other embodiments of the invention are directed to flexible capacitive coupler assemblies as described herein. Embodiments of the invention provide a computer and communication system made up of subsystems arranged together such that adjacent subsystems communicate with each other via surface-mounted flexible capacitive couplers located at designated brick surface positions and the method by which these couplers are mechanically and electrically connected to these subsystems.

Figure 11B:
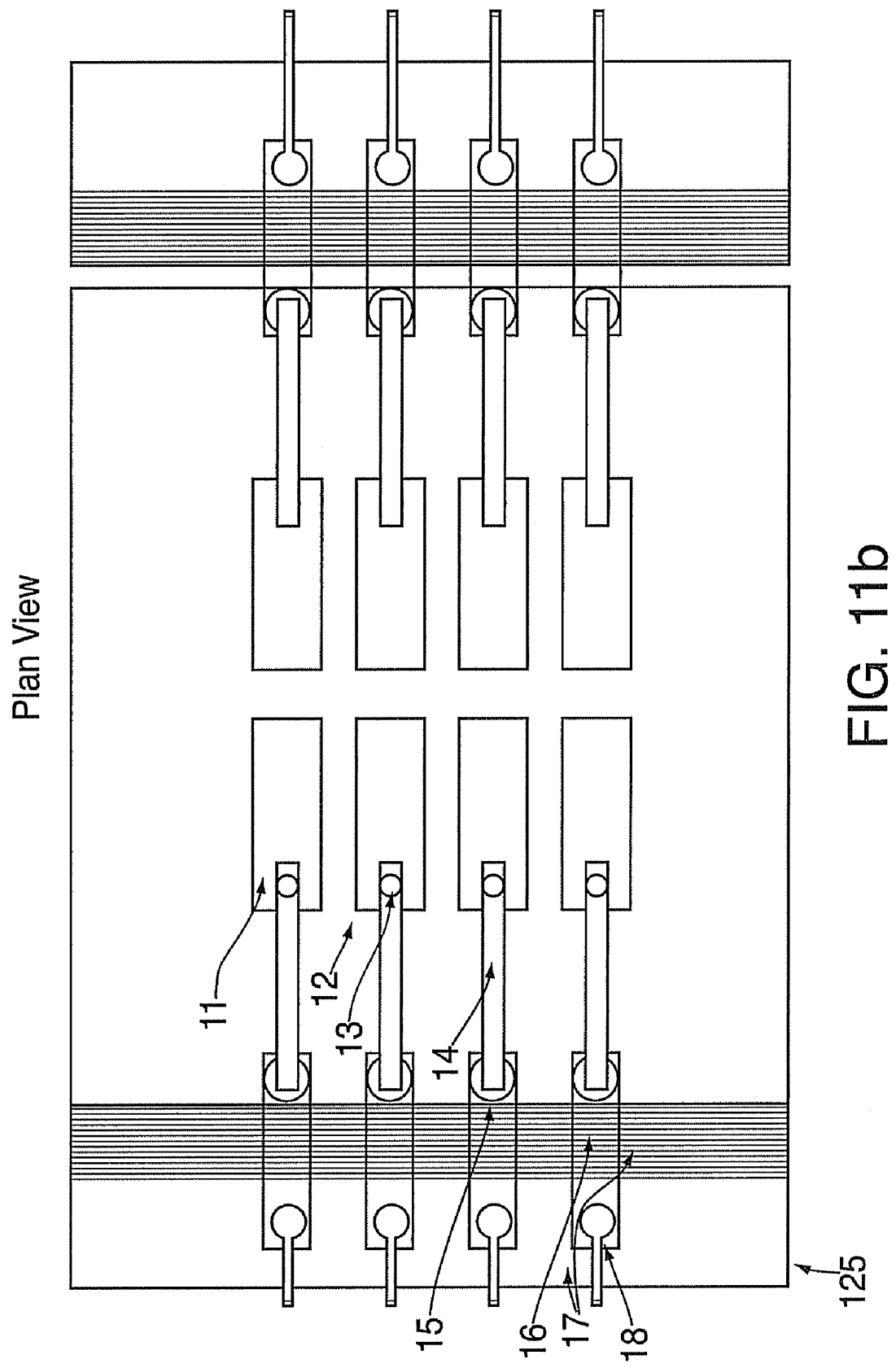

FIG. 11a is a cross-section of a first embodiment of the flexible capacitive coupler in which macroscopic metal capacitor pads 11 on the front surface of the flexible dielectric substrate 12 are connected through via 13 to wiring 14 on the back of the coupler. Wiring 14 leads to a package pad on which ball grid array (BGA) solder 15 is formed, enabling connection to wiring 16 on package 17. With the coupler assembly complete, the assembly can be wired to the computer subassembly via wirebonding or solder 18. A mechanical clip 125 is used to secure the capacitive coupler assembly to a computer system subassembly. FIG. 11b is a plan view of FIG. 11a.

In the embodiment of FIG. 11a, the flexible capacitive coupler is soldered into a package using a ball grid array (BGA) technology. BGA is an established technology used extensively for connection of ceramic and organic packages to circuit boards for high end applications. This technique provides parallel connection of the flexible coupler to a rigid package 17 which can be plugged into or otherwise electrically connected to the subsystem. This package includes of a rigid frame 17 with package pads 16 corresponding to the pads 11 on the coupler. These package pads 16 are wired out to secondary connections that create connection to the computer subsystem. This secondary connection to the subsystem can be to solder pads, which would utilize automated soldering techniques, or wirebond pads, as shown in FIG. 11a.

In order to connect the coupler to the package 17, solder balls 15 are formed on the pads 16 on the package by existing technologies (solder paste, injection molded solder, plating, etc). The coupler is then aligned to the package such that each pad 14 on the coupler matches with a pad 16 on the package 17, and the pads are brought into intimate contact. This assembly is then brought up to the reflow temperature of the solder, causing it to become molten and bond to both pads. The temperature is then dropped, and the parts are electrically and mechanically joined (additional, non-electrically functional pads can be included to allow for additional mechanical strength).

Figure 12:
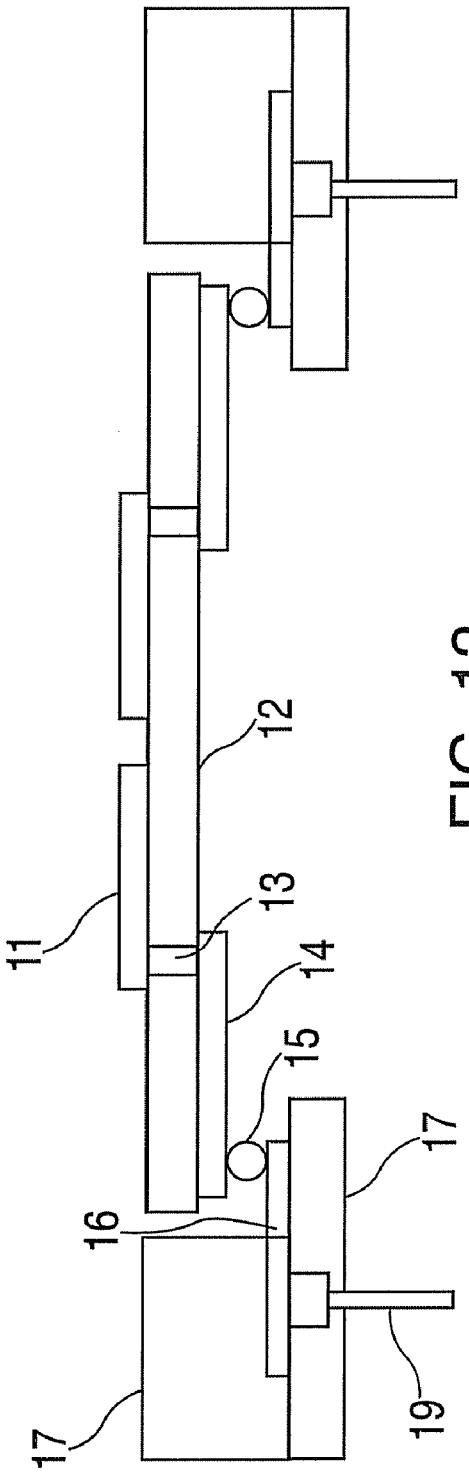
FIG. 12 is a cross sectional view of the first embodiment as shown in FIG. 11a, except where a pin and socket configuration replaces wirebonding or soldering.

FIG. 12 shows the capacitive coupler assembly in an alternate embodiment. FIG. 12 is a cross section view of the first embodiment as shown in FIG. 11a, except where a pin 19 is in electrical contact with package pad 16. The pin 19 will engage a socket on the computer subsystem. This pin and socket configuration replaces wirebonding or soldering 18 for lower cost assembly.

An exemplary process for making the capacitive coupler for the first embodiment as shown in FIG. 11a begins with a dielectric film 12 (e.g., Kapton) coated with metal (e.g., copper). The metal is patterned lithographically and etched to form the macroscopic capacitor pads 11 and front side leads as shown in FIGS. 11a and 11b. Vias 13 are then etched from the back side of film 12 using laser ablation or photolithography and reactive ion etching to make contact to the pads 11 on the front side. Metal (e.g., copper) is then coated on the back side of film 12 by physical vapor deposition and/or plating, such that the vias 13 are filled with metal and make contact to the front side metal. The metal is patterned lithographically and etched to form the solder pads and back side wiring 14. Ball grid array solder balls are now deposited onto the back side pads 14 by known technologies (solder paste screening, injection molded solder, etc).

A plastic frame 17 is formed by conventional molding techniques using a plastic which is rigid, electrically insulating, and able to withstand temperatures compatible with the melting point of the solder being used. Frame metal traces 16 are formed on the package by standard processing techniques (e.g., selective plating on plastic, metal screening or metal decals).

The coupler and package are now joined mechanically and electrically by aligning the back side coupler pads 14 to the package pads 16 on the package and holding the two together (such as by clamping or "gluing" together using a solder paste) such that pads on both side are in contact with the BGA solder 15. The assembly is then raised to the reflow temperature of the solder in a conventional reflow oven, such that the two join electrically and mechanically.

Finally, the capacitive coupler assembly is joined to the computer subassembly. If the capacitive coupler assembly is to be wirebonded or soldered as in FIGS. 11a and 11b, the package will be built in such a way as to have mechanical clips 125 which will mate to clips on the computer subassembly, allowing the two to be mechanically snapped together. Following this will be a wirebonding or automated soldering technique to attach the capacitive coupler assembly electrically to the computer subsystem. If the assembly is to use a pin and socket assembly as shown in FIG. 12, pins 19 will be braised or soldered to the package pads on the package. This may be done prior to attachment to the coupler, but it is possible to do it after as, or even at the same time. With the coupler assembly complete as shown in FIG. 12, it is ready to be plugged into a mating socket on the computer subassembly, providing a one step electrical and mechanical connection. An advantage of the structure of FIG. 12 is that it allows for easy removal and replacement of the coupler in the event of damage or a redesign.

Figure 13A:
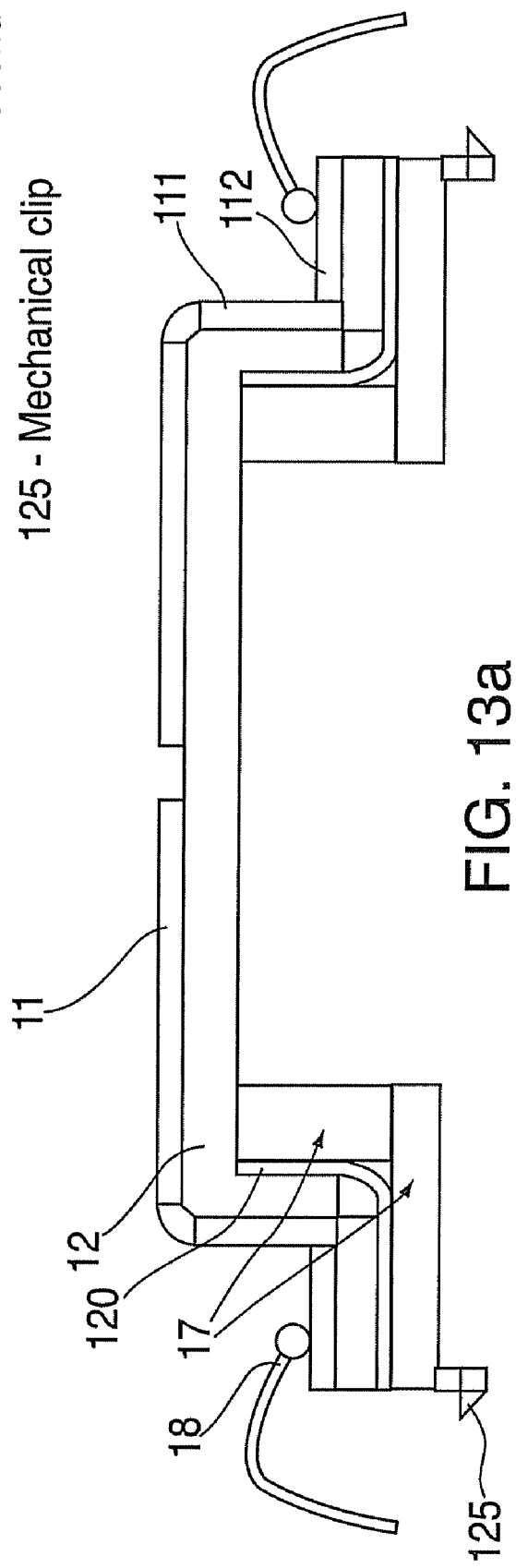
FIG. 13a is a cross-sectional view of a second embodiment of the flexible capacitive coupler.

FIG. 13a is a cross-sectional view of another embodiment of the flexible capacitive coupler in which the capacitor pads 11 on the front surface extend to the edge of the flexible dielectric substrate 12. The distal edge of the capacitor pads 11 can be wired to the subassembly via wire bonding or solder 18. In this case the flexible capacitive coupler is attached to the package 17 using an adhesive 120 between the flexible dielectric substrate 12 and the package 17.

Figure 13B:
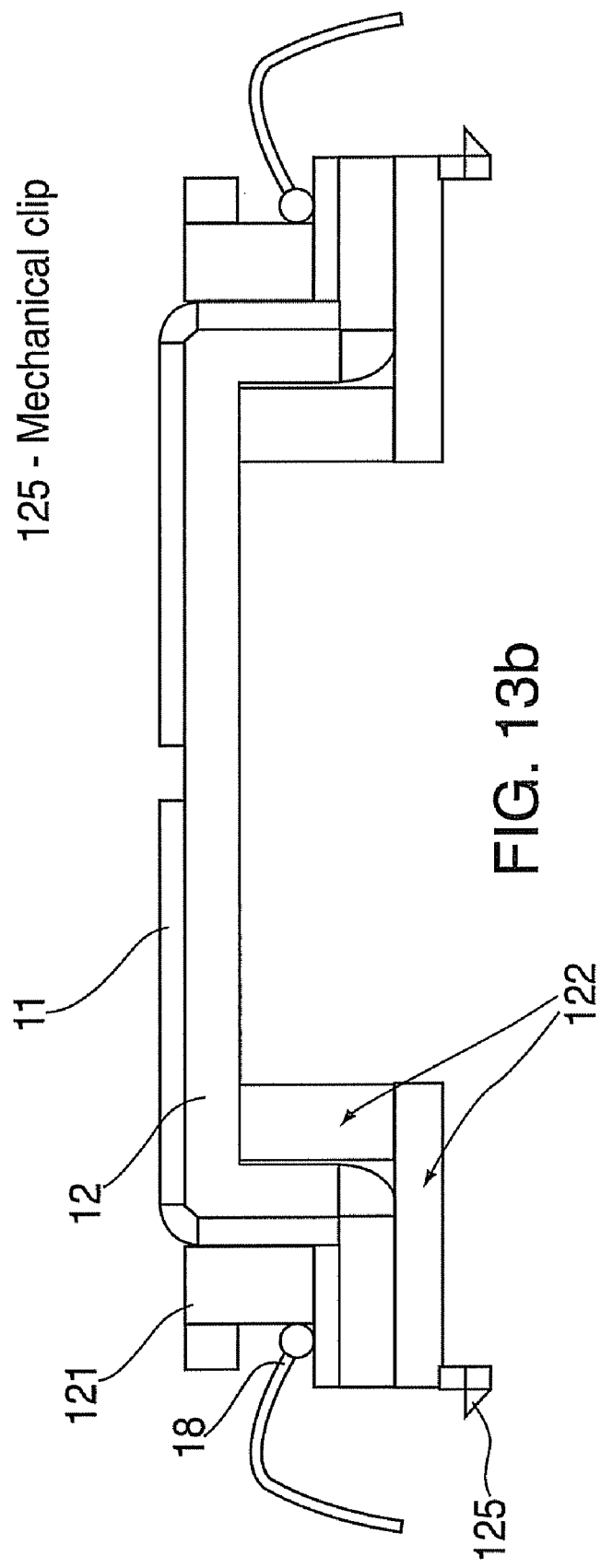
FIG. 13b is a cross-sectional view of the second embodiment of the flexible capacitive coupler in which the capacitor pads on the front surface are wired to the edge of the flexible dielectric substrate.

In FIG. 13a, the capacitive coupler is attached to package 17 for mechanical purposes. This joining can be accomplished using an adhesive as shown in FIG. 13a or a split frame as shown in FIG. 13b. In these embodiments, the capacitive coupler is held in place by the package 17, but the electrical connection is made directly from the coupler to the subassembly by an automated soldering technique or wire bonding. The advantage of this configuration is that the coupler is packaged and held rigidly, and can be easily connected mechanically to the subassembly, requiring only the electrical connection.

FIG. 13b is a cross-sectional view of an alternate embodiment similar to that of FIG. 13a. In FIG. 13b, the capacitive coupler including the flexible dielectric substrate 12 and capacitive coupler pads 11 secured to the package 17 without adhesive. In this case, the flexible capacitive coupler is affixed using a split frame with outer frame 21 and inner frame 22 formed by the package 17.

A exemplary process for making the capacitive coupler for the embodiment as shown in FIGS. 13a and 13b begins with dielectric film 12 (e.g., Kapton) coated with metal (e.g., copper). The metal is patterned lithographically and etched to form the capacitor pads 11 and leads 111 as shown in FIGS. 13a and 13b. In this embodiment, these leads 111 extend out right to and form pads 112 at the perimeter of the coupler.

A process flow for the package for the capacitive coupler begins with a plastic frame 17 built by conventional molding techniques using a plastic which is rigid, electrically insulating, and able to withstand temperatures compatible with temperatures that the assembly might be subjected to during subsequent processes.

The coupler and package are now joined mechanically by any technique, such as by applying an adhesive 120 to the package 17 where it will contact the capacitive coupler (see FIG. 13), and stretching the coupler over the package 17. Alternatively, a split-frame can be used in which the capacitive coupler is stretched across an inner frame 122, followed by a tight fitting outer frame 121 which will lock the capacitive coupler into place as shown in FIG. 13b.

Finally, the capacitive coupler assembly is connected to the computer subassembly. The capacitive coupler assembly is connected mechanically to the computer subassembly mechanically, such as by mechanical clips 125. This will be followed by wirebonding or automated soldering technique to attach the capacitive coupler electrically to the package.

Figure 14A:
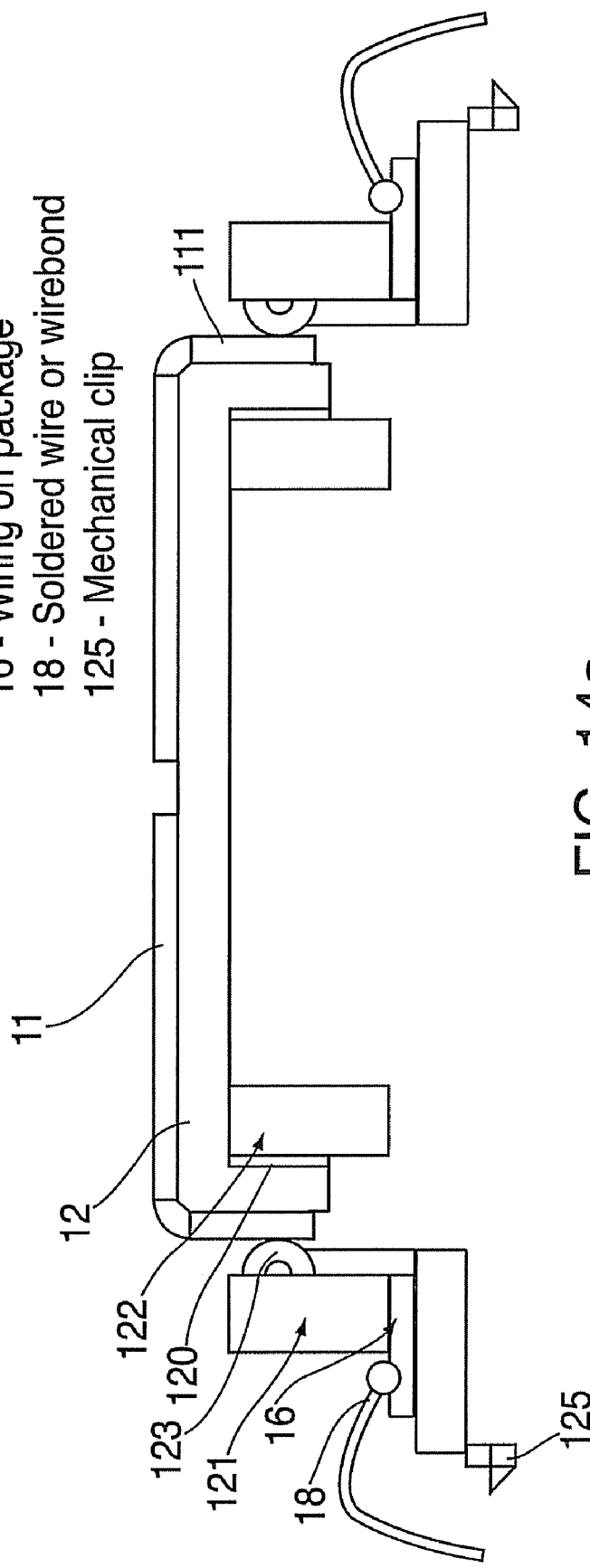
FIG. 14a is a cross-sectional view of a third embodiment of the flexible capacitive coupler.
Figure 14B:
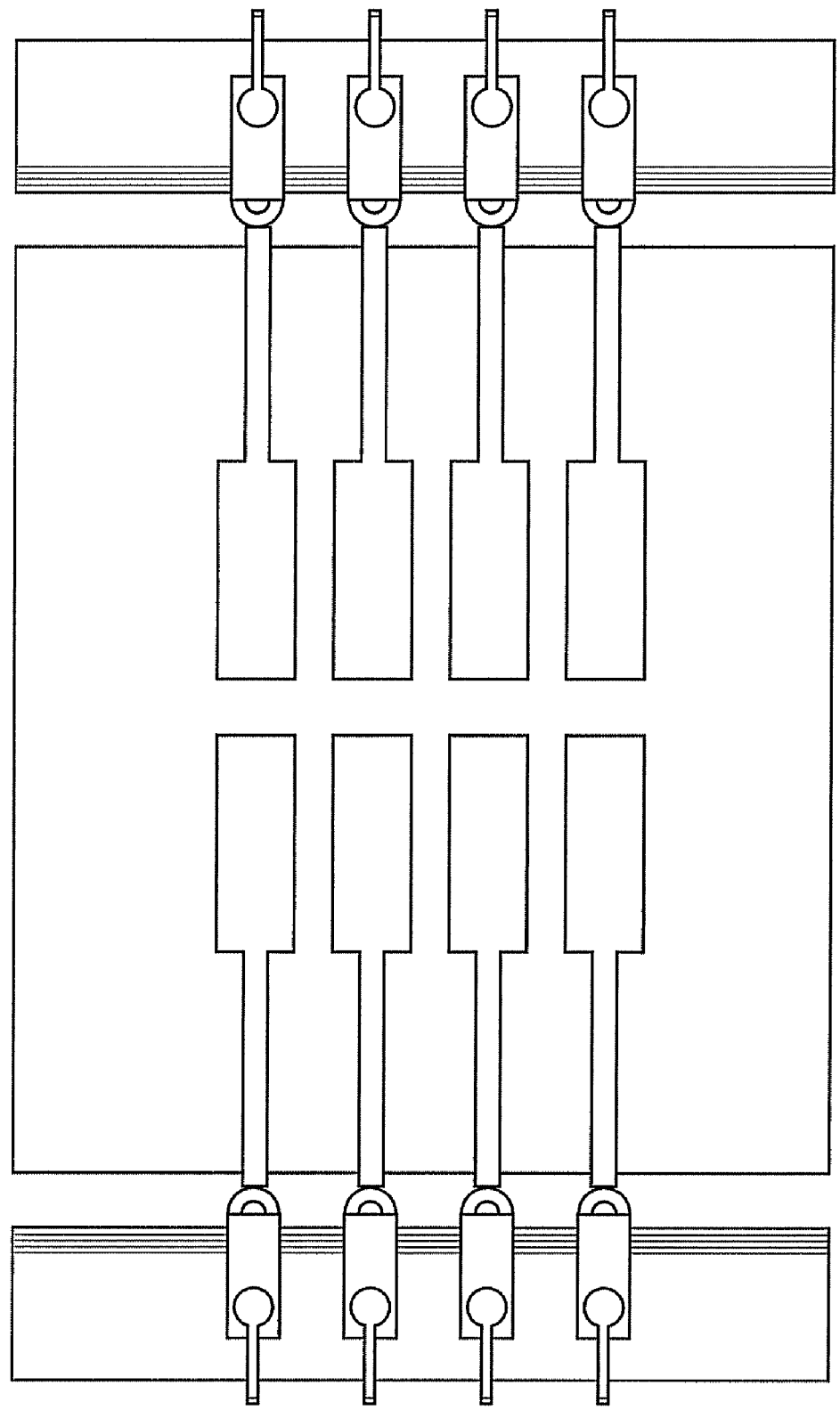

FIG. 14a is a cross-section of a third embodiment of the flexible capacitive coupler in which the capacitor pads 11 on the front surface are wired to the edge of the flexible dielectric substrate 12. FIG. 14b is a plan view of FIG. 14a. The dielectric substrate 12 is secured (e.g., with adhesive) to an inner frame of a package 122, and then pressed into the outer frame of the package 121 such that the capacitor pads 11 contact spring-loaded electrical contacts 123 on the outer portion of the package. These spring-loaded contacts 123 connect to wiring on the package which leads to package pads16 on the perimeter of the package where it can be wired to the subassembly via wirebonding or solder 18.

In FIG. 14a, the coupler is similarly joined to a package by either an adhesive 120 (as shown in FIG. 14a) or using a split-frame design such as that shown in FIG. 13b. In this case, the package has spring-loaded electrical contacts 123 which make electrical connection to the coupler capacitive coupler pads 11 on the edge of the capacitive coupler. The spring-loaded electrical contacts 123 are then wired out to pads 16 which make electrical connection to the computer subassembly by techniques such as automatic solder, wirebonding or pins as shown in FIG. 12. In alternate embodiments, the connection between the package wiring 16 and the subassembly is also made via similar spring-loaded clips to the subassembly.

The second and third embodiments have the advantage of the couplers only having wiring on one side of the substrate, and no through-vias. This greatly reduces the labor costs as it eliminates the need for the drilling of the flexible dielectric and patterning of the second side of the coupler.

An exemplary process for making the capacitive coupler for the third embodiment as shown in FIGS. 14a and 14b begins with a dielectric film 12 (e.g., Kapton) coated with metal (e.g. copper). The metal is patterned lithographically and etched to form the capacitor pads 11 and leads 111 as shown in FIGS. 14a and 14b. In this embodiment, these leads 111 extend out right to and form pads at the perimeter of the coupler.

The inner frame 122 of the package for the capacitive coupler is built by conventional molding techniques using a plastic which is rigid, electrically insulating, and able to withstand temperatures compatible with subsequent processes. Adhesive 120 can then be applied to the frame to aid in assembly. The capacitive coupler is stretched across the inner frame 122.

An exemplary process for making the outer frame 121 of the package for the capacitive coupler begins with a plastic frame built by conventional molding techniques using a plastic which is rigid, electrically insulating, and able to withstand temperatures compatible with subsequent processes. Metal traces and pads 16 are formed on the package by standard processing techniques (e.g., selective plating on plastic, metal screening or metal decals). High speed, spring-loaded electrical contacts 123 are then attached to the outer frame 121 in such a way as to make contact to the wiring 16 on the package.

The spring loaded electrical contacts 123 on the outer frame 21 are aligned to the leads 111 on the coupler, and the two halves are pressed together to provide mechanical connection and electrical connection.

Finally, the capacitive coupler assembly is connected to the computer subassembly. The capacitive coupler assembly is connected mechanically to the computer subassembly mechanically, such as by mechanical clips 125. This is followed by wirebonding or automated soldering 18 to attach the capacitive coupler electrically to the computer subsystem.

Figure 15:
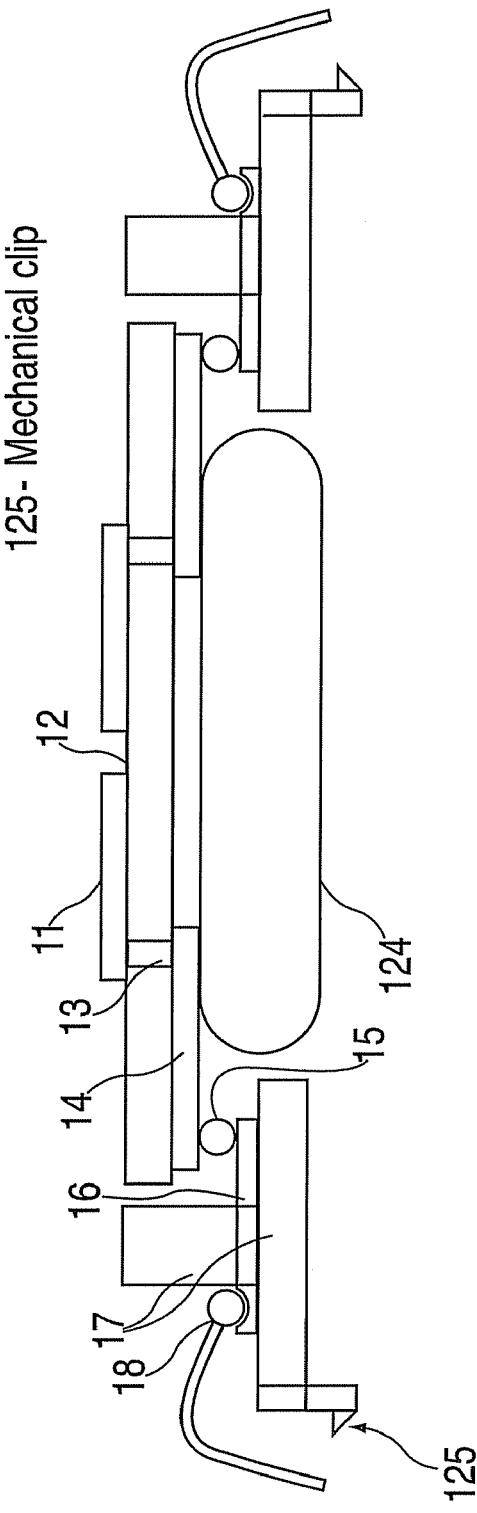
FIG. 15 shows a cross sectional view of the first embodiment having a backing inserted to provide pressure to the substrate.

FIG. 15 shows a cross sectional view as in FIG. 11 a in which a backing material 124 is inserted to provide pressure to the dielectric substrate 12 providing intimate contact with the corresponding capacitive coupler on a mating subassembly.

It is advantageous to add a material behind the membrane which will provide a backforce on the coupler to force good contact between the two mating couplers, as shown in FIG. 15. The backing material 124 can be a gas filled bladder, foam rubber, or any other material which is compliant, provides pressure and is compatible with the assembly procedures and operating conditions of the coupler.

Embodiments of the invention provide a computer and communication system made up of subsystems arranged together such that adjacent subsystems communicate with each other via surface-mounted flexible capacitive couplers located at designated surface positions and the method by which these couplers are mechanically and electrically connected to these subsystems.

The capacitive couplers in embodiments include a dielectric substrate on which macroscopic (one to several millimeter) metal pads are formed on the front surface, which correspond to metal pads on the subsystem to which it is to communicate. The dielectric substrate will be a flexible substrate, such as Kapton, Polyimide, Upilex, Teflon, etc, which have the advantages of eliminating variable of substrate flatness, improved, improved signal characteristics, reduced manufacturing costs and durability to shocks or twisting. The dielectric substrates are also able to withstand high temperatures and are chemically resistant.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A flexible capacitive coupler assembly comprising:
   a flexible dielectric substrate assembly having a front surface and a rear surface, the front surface having thereon a macroscopic metal capacitive pad, the rear surface having back-side wiring,
   the substrate having one or more thru-vias for making electrical connection between the metal pad and the back-side wiring;
   a package supporting the flexible dielectric substrate having package wiring thereon;
   a plurality of ball grid array solder balls electrically connecting the package wiring to the flexible dielectric substrate back-side wiring.

2. The flexible capacitive coupler of claim 1 wherein the solder balls are deposited as a solder paste.

3. The flexible capacitive coupler of claim 1 wherein the solder balls are dispensed as individual solder balls.

4. The flexible capacitive coupler of claim 1 wherein the package wiring is electrically connected to a computer subsystem by wirebonding or soldering.

5. The flexible capacitive coupler of claim 1 further comprising pins electrically connected to the package wiring, the pins received in a socket on a computer subsystem.

6. The flexible capacitive coupler of claim 1 wherein the package includes clips for connecting the package to a computer subsystem.

7. The flexible capacitive coupler of claim 1 further comprising a backing material positioned at the rear surface of the flexible dielectric substrate.

8. A flexible capacitive coupler assembly comprising:
   a flexible dielectric substrate assembly having a front surface and a rear surface, the front surface having thereon a macroscopic metal capacitive pad and leads extending towards an edge of the flexible dielectric substrate,
   a package supporting the flexible dielectric substrate assembly, the flexible dielectric substrate assembly mechanically secured to the package;
   an electrical connection from the leads on the flexible dielectric substrate assembly for making electrical connection with a computer subsystem.

9. The flexible capacitive coupler of claim 8 wherein the flexible dielectric substrate is secured to the package by an adhesive.

10. The flexible capacitive coupler of claim 8 wherein the flexible dielectric substrate is secured to the package by a split frame.

11. The flexible capacitive coupler of claim 10 wherein the split frame includes an inner frame positioned within an outer frame, the flexible dielectric substrate being positioned between the inner frame and the outer frame.

12. The flexible capacitive coupler of claim 8 wherein the leads are electrically connected to the computer subsystem by wirebonding or soldering.

13. The flexible capacitive coupler of claim 8 wherein the package includes clips for connecting the package to the computer subsystem.

14. The flexible capacitive coupler of claim 8 further comprising a backing material positioned at the rear surface of the flexible dielectric substrate.

15. A flexible capacitive coupler assembly comprising:
   a flexible dielectric substrate assembly having a front surface and a rear surface, the front surface having thereon a macroscopic metal capacitive pad and leads extending towards an edge of the flexible dielectric substrate,
   a package supporting the flexible dielectric substrate assembly, the flexible dielectric substrate assembly mechanically secured to the package, the package having package wiring thereon;
   spring-loaded electrical contacts supported on the package for establishing electrical contact between the package wiring and the leads on the flexible dielectric substrate.

16. The flexible capacitive coupler of claim 15 wherein the package includes an inner frame and an outer frame, the flexible dielectric substrate secured to the inner frame, the spring-loaded electrical contacts supported on the outer frame, the inner frame positioned with the outer frame to establish electrical contact between the leads and the spring-loaded electrical contacts.

17. The flexible capacitive coupler of claim 15 wherein the package wiring is electrically connected to a computer subsystem by wirebonding or soldering.

18. The flexible capacitive coupler of claim 15 wherein the package includes clips for connecting the package to a computer subsystem.

19. The flexible capacitive coupler of claim 15 further comprising a backing material positioned at the rear surface of the flexible dielectric substrate.

* * * * *